(12) United States Patent
Yamanaka

(10) Patent No.: US 6,920,404 B2
(45) Date of Patent: Jul. 19, 2005

(54) METHOD OF DETECTING RESIDUAL CAPACITY OF SECONDARY BATTERY

(75) Inventor: Kenji Yamanaka, Kyoto (JP)

(73) Assignee: Japan Storage Battery Co., Ltd., Kyoto (JP)

(*) Notice: Subject to any disclaimer, the term of this patent is extended or adjusted under 35 U.S.C. 154(b) by 71 days.

(21) Appl. No.: 10/148,234

(22) PCT Filed: Sep. 20, 2001

(86) PCT No.: PCT/JP01/08159

§ 371 (c)(1),
(2), (4) Date: May 28, 2002

(87) PCT Pub. No.: WO02/27343

PCT Pub. Date: Apr. 4, 2002

(65) Prior Publication Data

US 2002/0193954 A1 Dec. 19, 2002

(30) Foreign Application Priority Data

Sep. 28, 2000 (JP) .................................... 2000-295586

(51) Int. Cl.⁷ ............................................ G01R 31/36
(52) U.S. Cl. ......................... 702/63; 702/70; 702/182; 320/127; 320/134; 324/426; 324/433; 700/293; 700/297; 307/116; 307/125
(58) Field of Search ................ 702/60–65, 70, 702/124, 126, 180–184, 57, 187, 189, 198, FOR 103–106, 111, 134, 170, 171; 320/127, 134, 149–159; 324/426–437, 439, 441, 600–601, 649, 691, 720, 721; 700/293, 297, 298; 307/116, 125, 130, 131, 132 EA

(56) References Cited

U.S. PATENT DOCUMENTS

| 4,888,716 | A | | 12/1989 | Ueno | |
|---|---|---|---|---|---|
| 4,931,737 | A | | 6/1990 | Hishiki | |
| 5,404,106 | A | | 4/1995 | Matsuda | |
| 5,537,390 | A | * | 7/1996 | Horiba et al. | 320/3 |
| 5,565,756 | A | * | 10/1996 | Urbish et al. | 320/15 |
| 5,703,469 | A | * | 12/1997 | Kinoshita | 320/48 |

FOREIGN PATENT DOCUMENTS

| AT | 95315 | 10/1993 |
|---|---|---|
| BR | 8902773 | 2/1990 |

(Continued)

OTHER PUBLICATIONS

Yamazaki et al., 'Estimation of the Residual Capacity of Sealed Lead–Acid Batteries by Neural Network', Oct. 1998, IEEE Article, pp. 210–214.*

(Continued)

*Primary Examiner*—Marc S. Hoff
*Assistant Examiner*—Elias Desta
(74) *Attorney, Agent, or Firm*—Wenderoth, Lind & Ponack, L.L.P.

(57) ABSTRACT

Correlations between a residual capacity of a secondary battery and 4 parameters of an internal resistance, temperature, a discharge current and one of an open circuit voltage and a discharge voltage of the secondary battery are previously determined and a contour map of the residual capacity and 2 of the parameters is made, for example. Then, at least 2 varying parameters selected from the 4 parameters are detected while the secondary battery is in use and collated with the correlations to estimate the residual capacity of the secondary battery.

12 Claims, 5 Drawing Sheets

FOREIGN PATENT DOCUMENTS

| | | |
|---|---:|---|
| CN | 1039660 | 2/1990 |
| DE | 3712629 | 10/1987 |
| DE | 68909502 | 11/1993 |
| DE | 4418194 | 12/1994 |
| EP | 346970 | 12/1989 |
| EP | 0 622 863 | 11/1994 |
| EP | 0 714 033 | 5/1996 |
| GB | 2278452 | 11/1994 |
| JP | 62-240876 | 10/1987 |
| JP | 63-208773 | 8/1988 |
| JP | 1-313783 | 12/1989 |
| JP | 4-341769 | 11/1992 |
| JP | 5-322998 | 12/1993 |
| JP | 6-331715 | 12/1994 |
| JP | 8-83628 | 3/1996 |
| JP | 8-179018 | 7/1996 |
| JP | 8-233918 | 9/1996 |
| JP | 8-240647 | 9/1996 |
| JP | 9-61505 | 3/1997 |
| JP | 9-98506 | 4/1997 |
| JP | 9-115554 | 5/1997 |
| JP | 9-243717 | 9/1997 |
| JP | 11-38107 | 2/1999 |
| JP | 11-162524 | 6/1999 |
| JP | 11-162526 | 6/1999 |
| JP | 2000-012104 | 1/2000 |
| JP | 2001-196100 | 7/2001 |

OTHER PUBLICATIONS

Yanagihara et al., 'Residual Capacity Estimation of Sealed Lead–Acid Batteries for Electric Vehicles', Aug. 1997, IEEE Article, pp. 943–946.*

Vutetakis et al., 'Batteries', Jan. 2001, CRC, pp. 1–30.*

Spath et al., 'The Detection of the State of Health of Lead–Acid Batteries', Jul. 1997, IEEE, pp. 681–686.*

Heron et al., 'Evaluation of Conductance and Imedance Testing on VRLA Batteries for the Stentor Operating Companies', Apr. 1994, IEEE, pp. 270–281.*

Johnson et al., Temperature–Dependent Battery Models for High–Power Lithium–Ion Batteries, Jan. 1999, NREL, 1–12.*

* cited by examiner

METHOD OF DETECTING RESIDUAL CAPACITY OF SECONDARY BATTERY

BACKGROUND OF THE INVENTION

1. Field of the Invention

The present invention relates to a method for estimating a residual capacity of a secondary battery.

2. Description of the Prior Art

In the case where a secondary battery is used in an electric vehicle, for example, estimating a residual capacity of the secondary battery is important to know the mileage possible to gain before the next charge. Also, in the case where a secondary battery is used in uninterruptible power supply equipment, it is important to know a backup time at a power failure.

Consequently, methods for estimating a residual capacity of a secondary battery have been proposed. Estimating a residual capacity by measuring an open circuit voltage of a storage battery is one of these methods. This method is based on such relationships that an open circuit voltage of a lead acid battery is proportional to a sulfuric acid concentration in an electrolyte, whereas the sulfuric acid concentration is correlated with a residual capacity. However, this method has a problem that a water loss during the use of the battery would cause an increase of the sulfuric acid concentration and would change the relationship between the sulfuric acid concentration and the residual capacity, which would result in the lower estimating accuracy.

On the other hand, there also is an attempt to determine a residual capacity by integrating the electrical charge-discharge quantities of a secondary battery in use. For example, in the method disclosed in Japanese Patent Application Laid-Open No. H8-240647, a residual capacity (SOC: State Of Charge) was calculated according to an approximate linear function previously determined by measuring a discharge current and a discharge voltage from a battery while electricity was being discharged from the battery. Further, in the method disclosed in Japanese Patent Application Laid-Open No. H11-38107, a charge-discharge current and temperature were measured first, and then, SOC was calculated by integrating the electrical charge-discharge quantities while correcting them depending on the temperature.

However, above-described methods have a problem that when the battery has been used over a prolonged period, cumulative error would gradually lower the accuracy. To avoid the cumulative error, the integrated value has to be reset when the battery is fully charged. However, in the case where the battery is continuously used in partially charged state, the cumulative error is inevitable because there is no chance to reset the value.

Moreover, a lead acid battery, for instance, will be deteriorated because of various factors like self-discharge, grid corrosion, water loss, softening of a positive active material, lead sulfate accumulation onto a negative active material, etc. All the above-described methods have a problem that the estimating accuracy would become poorer after the deterioration.

Therefore, an object of the present invention is to provide a method for estimating a residual capacity of a secondary battery with high accuracy even after a deterioration of the secondary battery.

SUMMARY OF THE INVENTION

To solve the above-described problems, the methods according to the present invention have such features that a residual capacity of a secondary battery is estimated by assigning 4 parameters of an internal resistance, temperature, a discharge current and one of an open circuit voltage and a discharge voltage of the secondary battery, and collating them with previously determined correlations between the 4 parameters and the residual capacity of the secondary battery.

Through many experiments of measuring open circuit voltages of various types of batteries, including new batteries and deteriorated batteries, while they were discharged under the conditions of varying temperature and current, we found the fact that 4 parameters of an internal resistance, temperature, a discharge current and one of an open circuit voltage and a discharge voltage are correlated with a residual capacity of the battery. Therefore, if the correlations between the 4 parameters and the residual capacity are previously determined by directly measuring them, the residual capacity can be estimated only by assigning the 4 parameters whatever the history the battery has, such as new or deteriorated, etc. This method is suitable especially for estimating the residual capacity of a lead secondary battery with high accuracy.

Moreover, according to the present invention, all the 4 parameters may be detected by actual measurement and collated with the previously determined correlations. However, under the conditions in which 1 or 2 parameters can be assumed to be constant, the residual capacity is able to be estimated by detecting only 2 parameters. For example, to estimate the residual capacity of a battery used under almost constant temperature and having been discharged by a predetermined discharge current, the discharge current and the temperature can be assumed to be certain values without measuring them while the open circuit voltage and the internal resistance should be detected to assign the 4 parameters. Then, the assigned 4 parameters are collated with the previously determined correlations. Here, an open circuit voltage is preferably detected as a voltage because it enables an estimation of a residual capacity with high accuracy, but a discharge voltage is possibly detected instead because an open circuit voltage can be calculated from a discharge voltage when a discharge current and an internal resistance are known. Further, the detection of the parameters should be done just before estimating the residual capacity to improve the accuracy at the estimation.

Still further, the above-described correlations can be expressed in 4 or 3 dimensional graph with 4 parameters as well as in a set of 2 dimensional graphs. When the correlations are expressed in a set of 2 dimensional graphs, the axes should preferably be an internal resistance and one of an open circuit voltage and a discharge voltage. To simplify the graphs, a voltage-resistance graph at a certain temperature and discharge current should be made. Referring to this graph, the residual capacity at any temperature and discharge current can be estimated with the detected voltage (open circuit voltage or discharge voltage) and internal resistance by multiplying the capacity by a temperature coefficient and a discharge current coefficient.

DETAILED DESCRIPTION OF THE INVENTION

Figure 1:
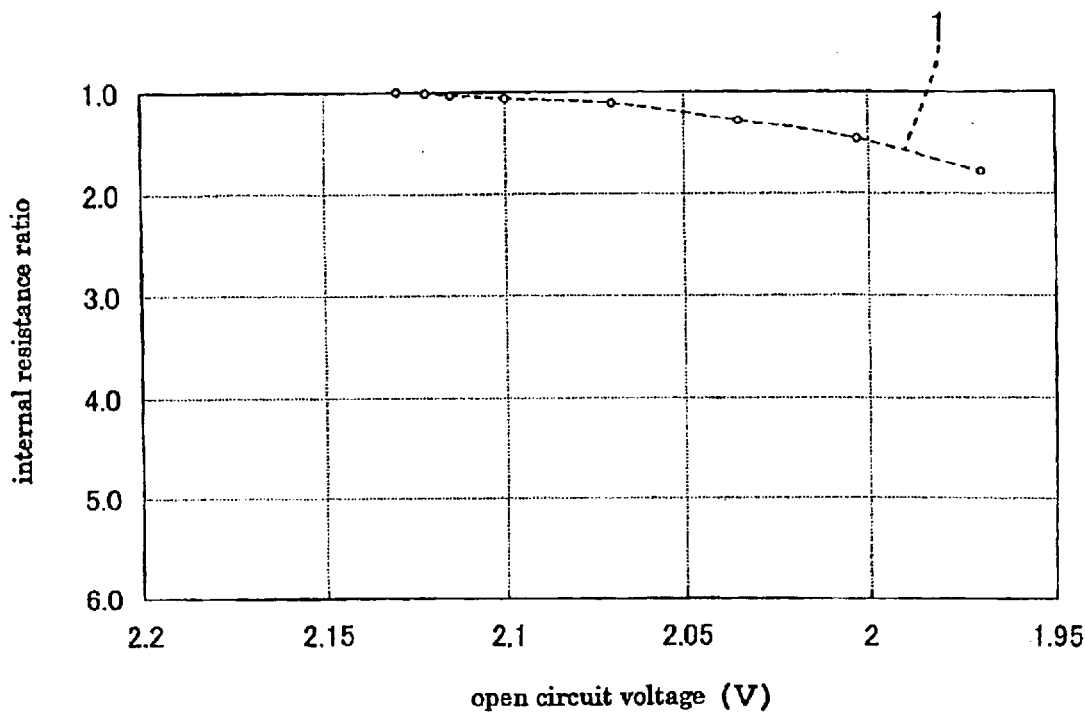
FIG. 1 is a graph showing the result of the measurement on a new battery.

Hereinbelow, one of the embodiments according to the present invention will be described with reference to the drawings. In this embodiment, experiments were conducted on valve regulated lead acid batteries with a rated capacity of 20 Ah under the voltage of 2 V, 5-hour rate.

First, the above-described batteries had been deteriorated to various levels through the following experiments (1)–(4) before their discharge capacities were measured under the discharge currents of 0.05 CA–15 CA which each of them exhibited at 10° C.–60° C. The discharge voltages and the corresponding discharge cut-off voltages are shown in the following table.

| discharge current | discharge cut-off voltage |
| --- | --- |
| 0.05 CA or more and less than 0.15 CA | 1.80 V |
| 0.15 CA or more and less than 0.25 CA | 1.75 V |
| 0.25 CA or more and less than 0.50 CA | 1.70 V |
| 0.50 CA or more and less than 0.80 CA | 1.60 V |
| 0.80 CA or more and less than 2.0 CA | 1.50 V |
| 2.0 CA or more and less than 15 CA | 1.00 V |

In the following, the experiments will be described in detail.

(1) Discharge Experiment of New Batteries

New batteries were discharged by 0.2 CA at 25° C. for one of the 6 periods of 15 min, 30 min, 1 hour, 2 hours, 3 hours and 4 hours, or discharged by 0.2 CA to 1.75 V, before the internal resistance and the open circuit voltage were measured. After that, the residual capacity of each battery was measured at various temperatures under the various discharge currents representing the respective ranges of the above-described discharge currents.

For example, in order to measure the residual capacity under the current of 1.0 CA at various temperatures about a battery having been discharged by the discharge current of 0.2 CA for 15 in, the temperature was subsequently changed to –10° C. and the residual capacity under the current of 1.0 CA was measured. Then, the battery was fully charged at 25° C. before being discharged by 0.2 CA for 15 min again, before the temperature was changed to 0° C. and the residual capacity under the current of 1.0 CA was measured.

In this manner, when the residual capacity was measured under the current of 1.0 CA after the battery had been discharged by 0.2 CA for 15 min from fully charged state, the temperature was changed to various values.

In the same way, the residual capacity of a battery having being discharged by 0.2 CA for 15 min was measured at various temperatures under the various discharge currents in the range of 0.05 CA–15 CA.

Here, the internal resistance was measured by "AC 4-terminal method", in which a voltage with a frequency of 1 kHz is applied.

(2) Deterioration Experiment by Over Discharge

Batteries were deteriorated through over charge by 0.1 CA for 100 hours at 25° C. before the internal resistance and the open circuit voltage were measured. Then, the residual capacity was measured under various discharge currents at various temperatures. After that, discharge tests were conducted in the same manner as described in (1) using these batteries. Except, in the case where the discharge voltage was dropped to 1.75 V before finishing the predetermined discharge period of 15 min, 30 min, 1 hour, 2 hours, 3 hours or 4 hours by 0.2 CA due to the gradual deterioration through over charge, discharge was stopped at that moment and the following steps were carried on.

These over charge and following discharge tests were repeated until the discharge capacity under 0.2 CA after being over charged for 100 hours became 10% of the initial value or less.

(3) Shallow Cycle Endurance Experiment

The shallow cycle endurance tests according to JIS D 5301 were carried out at 40° C. and the internal resistance and the open circuit voltage were measured in every 1920 cycles, before measuring the residual capacity under various discharge currents at various temperatures. After that, discharge tests were conducted in the same manner as described in (1), using these batteries. Except, in the case where the discharge voltage was dropped to 1.75 V before finishing the predetermined discharge period of 15 min, 30 min, 1 hour, 2 hours, 3 hours or 4 hours by 0.2 CA due to the gradual deterioration through cycle life tests, discharge was stopped at that moment and the following steps were carried on.

These cycle life tests and discharge tests after 1920 cycles were repeated until their cycle life ended at shallow cycle endurance tests.

(4) Cycle Life Experiment in Partially Charged State

Batteries were discharged by 10% of the rated capacity by the current of 0.2 CA before being discharged by 30% of the rated capacity by 0.2 CA at 25° C., and then, being charged. When batteries in a partially charged state like these were conducted to cycle life tests, the capacity would decrease because of the gradual lead sulfate accumulation onto the plate. Therefore, the batteries were recovery charged by 4 Ah by 0.1 CA every 100 cycles. In this experiment, the internal resistance and the open circuit voltage were measured every 1000 cycles followed by measuring the residual capacity under various discharge currents at various temperatures. After that, discharge tests were conducted in the same manner as described in (1) using these batteries. Except in the case where the discharge voltage was dropped to 1.75 V before finishing the predetermined discharge period of 15 min, 30 min, 1 hour, 2 hours, 3 hours or 4 hours by 0.2 CA due to the gradual deterioration through cycle life tests, discharge was stopped at that moment and the following steps were carried on. The above-described cycle life tests and discharge tests after 1000 cycles were repeated until the minimum voltage during the cycle dropped to 1.75 V.

The open circuit voltage and the internal resistance measured after the batteries having been discharged by 0.2 CA for 15 min, 30 min, 1 hour, 2 hours, 3 hours or 4 hours in experiment (1) are shown in FIG. 1, as well as those after having been discharged to 1.75 V. In FIG. 1, the internal resistance is expressed as the internal resistance ratio on the basis of the initial internal resistance value defined to be 1.0.

During the discharge of new batteries by 0.2 CA, the state of the batteries had changed along the broken line in FIG. 1. As compared to fully charged batteries, the batteries having been discharged to 1.75 V exhibited the internal resistance of almost 1.8 times bigger than the initial value, and the open circuit voltage dropped from about 2.13 V to about 1.97 V.

Figure 2:
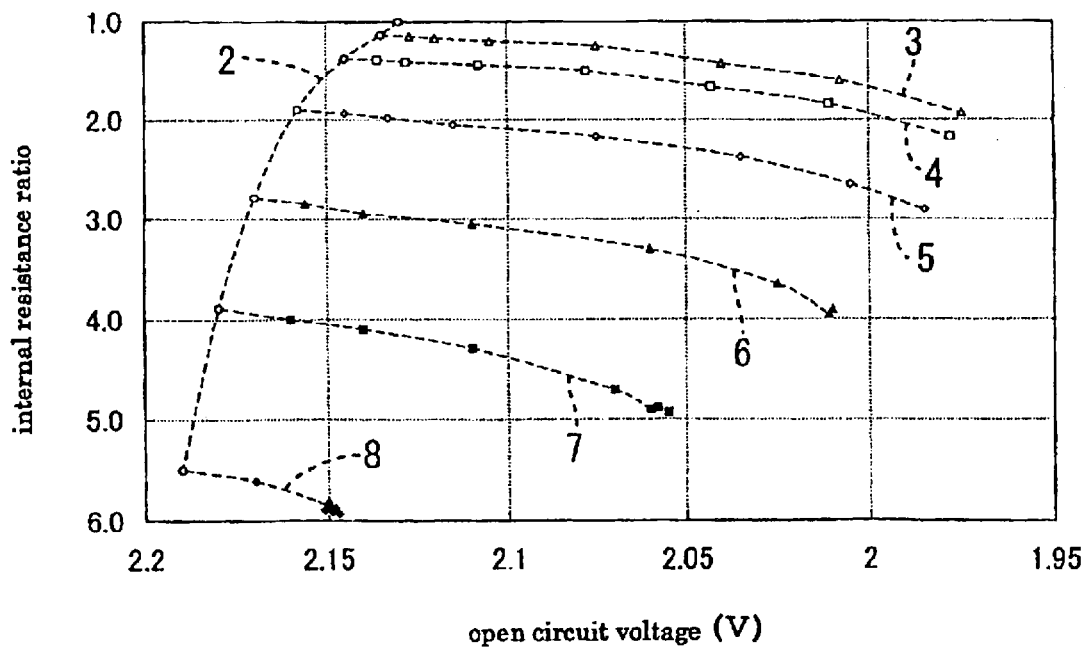
FIG. 2 is a graph showing the result of the measurement an a battery deteriorated through over charge.

On the other hand, during the deterioration experiment (2) causing the water loss and the grid corrosion in batteries by over charge, the state of the batteries had changed as shown in the broken line 2 in FIG. 2. This result is reflecting the worst contact of the plate and the separator caused by the water loss, the larger internal resistance caused by the corrosion of the positive electrode grid, and further, the higher open circuit voltage caused by the increase in relative density of the electrolyte. During the discharge tests conducted in the same manner as described in experiment (1) every 100 hours of over charge, the state of the batteries had changed along the broken lines 3–8 shown in FIG. 2. As the batteries were deteriorated and the state of the batteries moved to the lower region of FIG. 2, the residual capacity became smaller and more batteries showed the discharge voltage dropped to 1.75 V before finishing the predetermined discharge periods of 15 min–4 hours by 0.2 CA.

Figure 3:
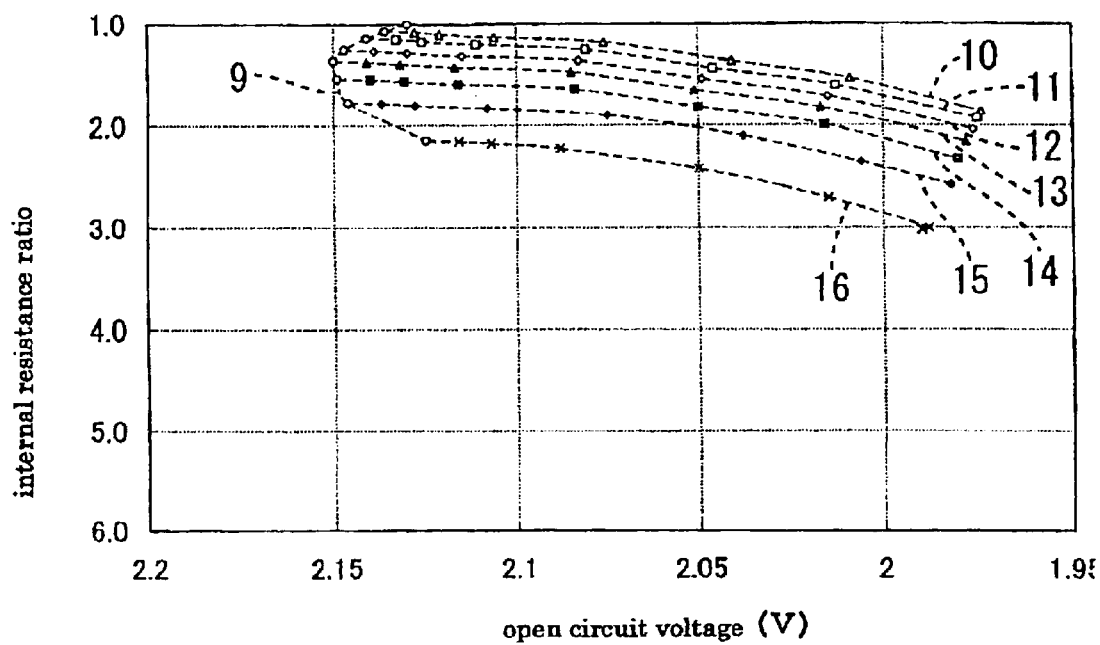
FIG. 3 is a graph showing the result of the measurement on a battery having experienced a shallow cycle endurance test.

The open circuit voltage and the internal resistance measured in the repeated shallow cycle endurance test and discharge test after 1920 cycles in the shallow cycle endurance experiment (3) are shown in FIG. 3. In the former part of this experiment, the state of the batteries had changed along the line that had been measured in experiment (2), while in the latter part, it turned the course toward the lower right region of the graph (the broken line 9). The analysis of the active material of the broken down batteries after the tests showed lead sulfate in the negative active material. From this analytical result and the lines along which the state of the batteries had changed, the deterioration in the former part of this experiment would mainly be attributed to the water loss. After the water loss proceeded to a certain degree, the lead sulfate accumulation onto the negative active material would lower the relative density of the electrolyte, which resulted in the decrease in the open circuit voltage. In addition to that, the grid corrosion gradually proceeded from the beginning would be one of the contributing factors of the increase in the internal resistance.

During discharge tests conducted in the same manner as described in experiment (1) every 1920 cycles, the state of the batteries had changed along the broken lines 10–16 shown in FIG. 3. The residual capacity had become smaller at the latter stages of the cycle life. When the batteries discharged by 0.2 CA, the discharge voltage dropped to 1.75 V within 4 hours.

Figure 4:
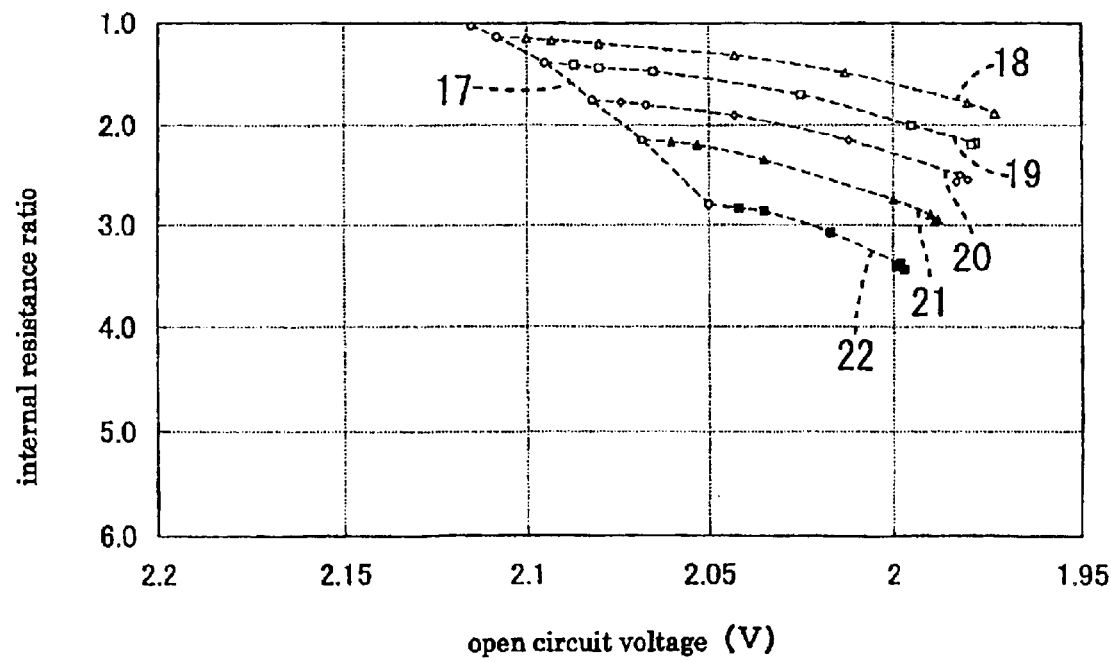
FIG. 4 is a graph showing the result of the measurement on a battery used in a partially charged state.

During the cycle life experiment (4) at which batteries were conducted to cycle life tests in a partially charged state, the state of the batteries had changed along the broken line 17 in FIG. 4. This can be attributed to the increase in the internal resistance caused by the water loss and by the grid corrosion, as well as the decrease in the open circuit voltage caused by the lead sulfate accumulation, both gradually proceeded simultaneously. During discharge tests conducted in the same manner as described in experiment (1) every 1000 cycles, the state of the batteries had changed along the broken lines 18–22 in FIG. 4. As the batteries were deteriorated through cycle life tests and the state of them moved to the lower region of the graph, the residual capacity became smaller and more batteries showed the discharge voltage dropped to 1.75 V before finishing the predetermined discharge periods of 15 min, 30 min, 1 hour, 2 hours, 3 hours or 4 hours by 0.2 CA.

Figure 5:
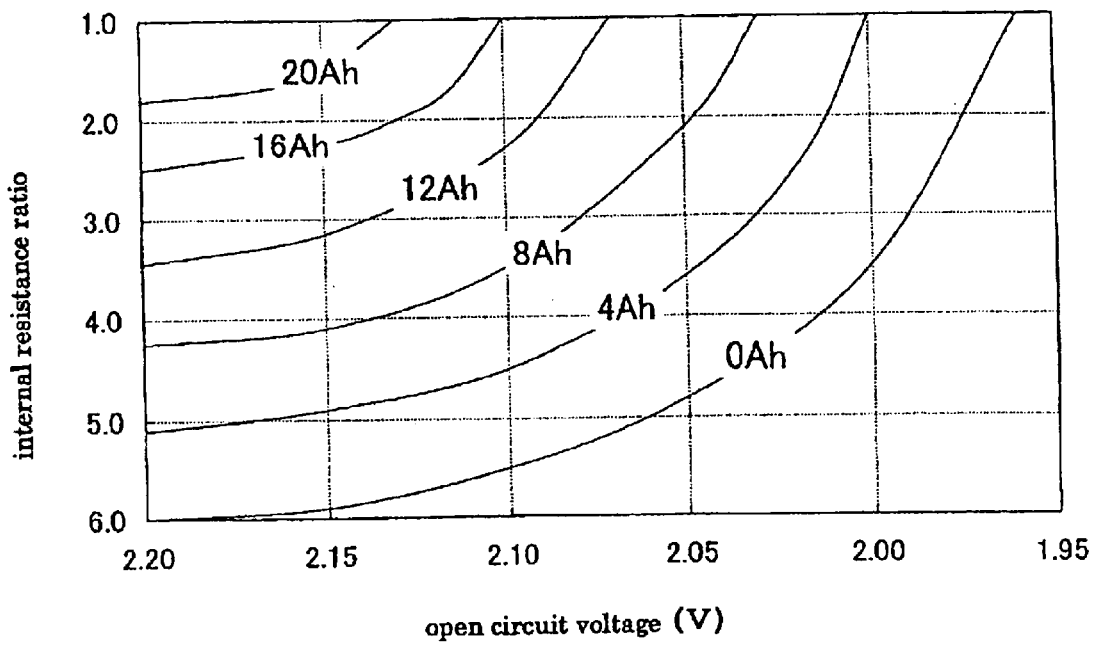
FIG. 5 is a graph showing a residual capacity of a battery being discharged by 0.2 CA at 25° C.
Figure 6:
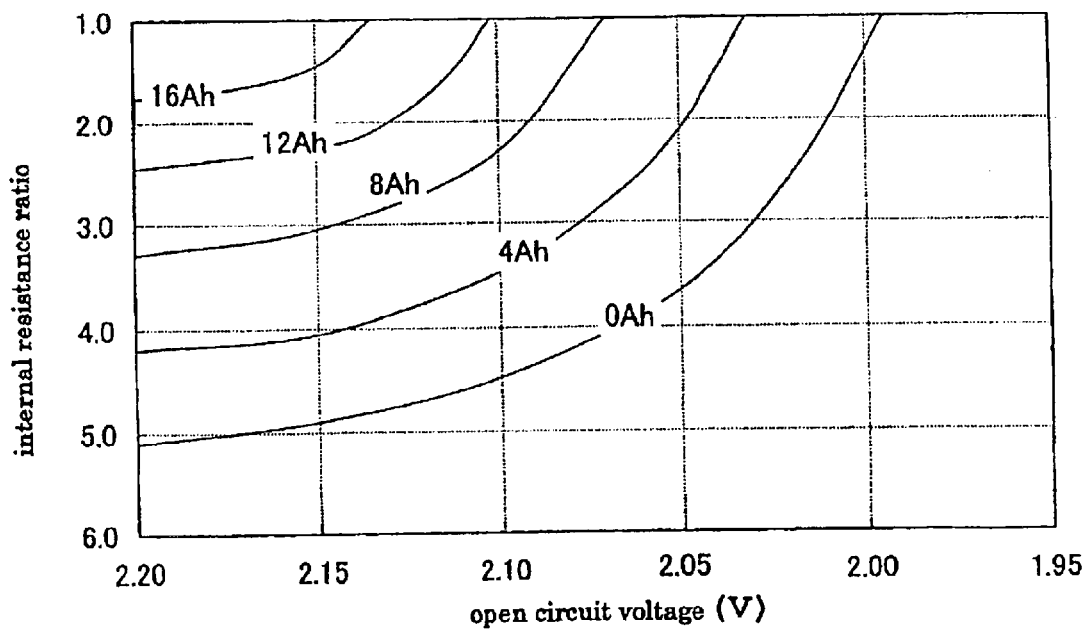
FIG. 6 is a graph showing a residual capacity of a battery being discharged by 0.2 CA at 0° C.
Figure 7:
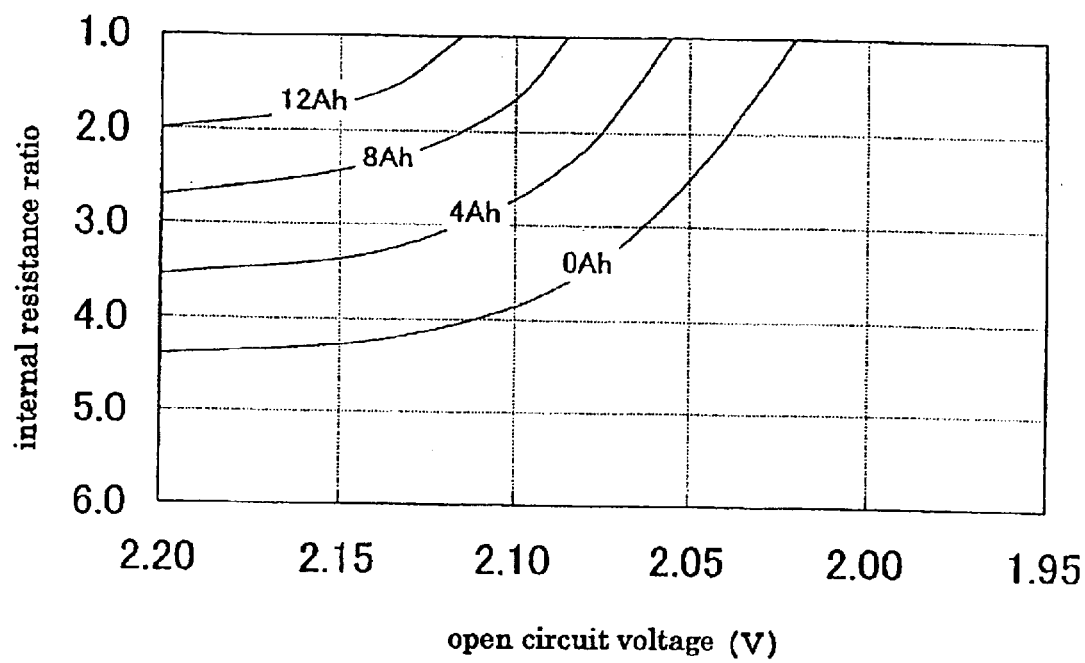
FIG. 7 is a graph showing a residual capacity of a battery being discharged by 1.0 CA at 25° C.

Next, a contour map of the residual capacity was made based on the data at all the plotted points shown in FIGS. 1–4. Examples of the contour map are shown in FIGS. 5 and 6 in which 2 parameters of temperature and a discharge current are fixed, whereas 2 parameters of an open circuit voltage and an internal resistance are varying. Further, a similar map under the condition of 1.0 CA is shown in FIG. 7. Contour maps of the residual capacity were made about all the data measured in experiments (1)–(4) indicating residual capacities approximately equal to the measured actual values. In other words, it was proved that the residual capacity indicated by a contour map is almost always consistent with the actual value so that a residual capacity of a battery in any deteriorated state can be estimated with only one contour map.

This means that a residual capacity of a battery at a certain point in time can be estimated from the previously made contour map (the correlations between a residual capacity and the 2 parameters of an open circuit voltage and an internal resistance of the battery) by measuring an open circuit voltage and an internal resistance.

The open circuit voltages herein had been converted into values per cell. In order to improve the accuracy, a contour map is preferably made about a battery of same structure with the objected battery. In the measurements for FIGS. 1–7, an internal resistance ratio measured by AC 4-terminal method was used as the internal resistance. However, an internal resistance could be determined by so-called "discharge I–V methods" based on the relationship between a voltage at a fifth second at discharges of the battery by various currents during experiments and respective currents, and the same results were obtained. Therefore, an internal resistance can be measured by any one of AC 4-terminal method and discharge I–V methods. Further, a discharge voltage can be used instead of an open circuit voltage of a secondary battery because of the relationship of "discharge voltage=open circuit voltage−discharge current×internal resistance".

In cases where 2 parameters out of the 4 parameters of an open circuit voltage, an internal resistance, temperature and a discharge current can be fixed, a contour map as shown in FIGS. 5–7 can be used. However, in case 3 parameters are varying, a 3 dimensional distribution map of a residual capacity with X-axis, Y-axis, Z-axis of the varying 3 parameters may be made. For example, when a discharge current is fixed and an open circuit voltage, an internal resistance and temperature are varying, a distribution map of a residual capacity with an X-axis of an open circuit voltage, a Y-axis of an internal resistance and a Z-axis of temperature would help to determine the correlations between the 3 parameters and the residual capacity. This distribution map is equivalent to contour maps at various temperatures with the X-axis of an open circuit voltage and the Y-axis of an internal resistance accumulated in direction of the Z-axis.

Further, in FIGS. 1–7 showing a residual capacity, temperature and a discharge current were fixed and an open circuit voltage and an internal resistance were varying. However, to predict changes in a residual capacity of a battery in a certain deteriorated state by various discharge currents depending on temperature, such a contour map can be made and used that with varying temperature and discharge current under an open circuit voltage and an internal resistance both fixed at the values which the battery is indicating.

Still further, contour maps or distribution naps were used in the foregoing description. However, a residual capacity can be calculated from an approximate expression made to be consistent with the contour map or the distribution map of a residual capacity, by using 2 or more parameters selected from 4 parameters of an open circuit voltage, an internal resistance, temperature and a discharge current.

Figure 8:
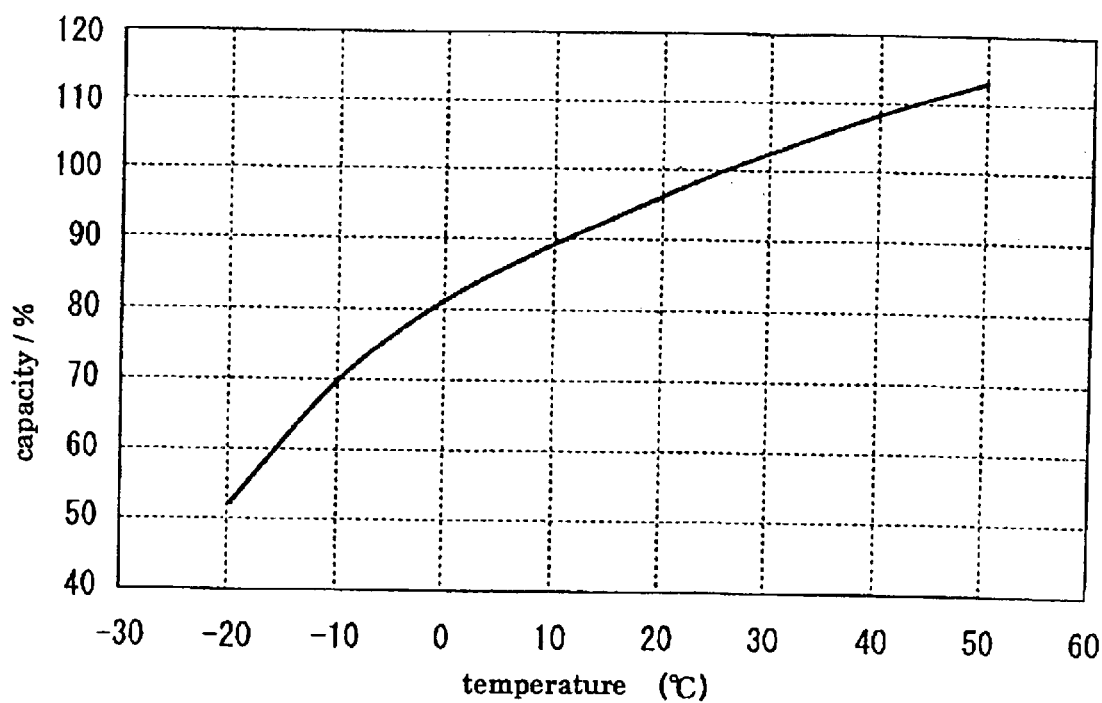
FIG. 8 is a graph showing a relationship between temperature and a capacity.
Figure 9:
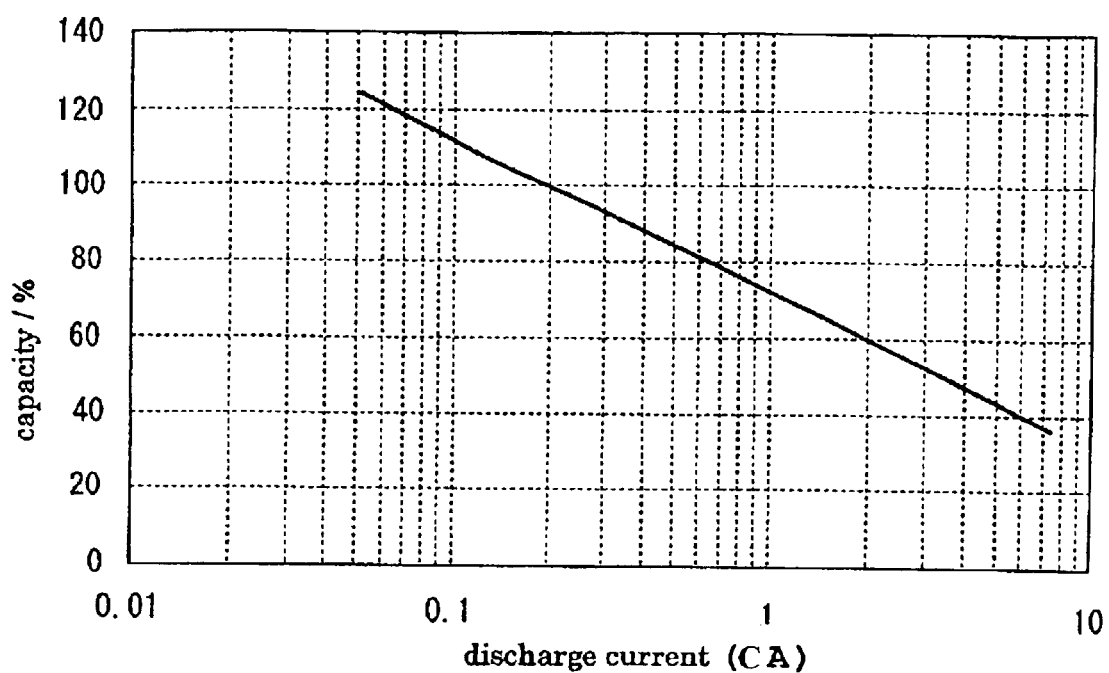
FIG. 9 is a graph showing a relationship between a discharge current and a capacity.

Still further, a residual capacity can be estimated also in the following manner. First, correlations between a residual capacity and 2 parameters of an open circuit voltage and an internal resistance of an objected secondary battery under any certain temperature and discharge current should be determined. Next, the open circuit voltage (or the discharge voltage) and the internal resistance of the battery in use should be measured. The residual capacity under any temperature and discharge current can be estimated from the measured values and the previously determined correlations. Between a capacity of a battery and temperature is a relationship such as shown in FIG. 8, for example, whereas between a capacity of a battery and a discharge current is a relationship such as shown in FIG. 9, for example. From these graphs, a temperature coefficient and a discharge current coefficient can be determined, and further, a residual capacity of the battery in use can be calculated by multiplying the capacity indicated by the previously determined correlations by these coefficients. Herein, FIG. 8 shows a relationship between a capacity and temperature of a new battery discharged by the discharge current of 0.2 CA from a fully charged state. Accurately, as well as in FIG. 9, it would change depending on the history of the battery, including its deterioration level. However, the differences might be negligible.

Therefore, the residual capacity of a battery in use discharged by a certain discharge current at a certain temperature can be estimated only by multiplying the provisional residual capacity calculated from the above-described correlations with the open circuit voltage (or the discharge voltage) and the internal resistance by the temperature coefficient and the discharge current coefficient each corresponding to the certain temperature and the certain discharge current. This means correlations between a residual capacity and an open circuit voltage (or a discharge current) and an internal resistance should only be determined under any temperature and discharge current. Thus, the correlations can be determined more easily.

The foregoing embodiments are merely illustrative of the principle of the present invention and are not to be construed in a limiting sense. For example, those embodiments are also seen to fall within the scope of the invention.

In the foregoing embodiments, the batteries of which residual capacities were estimated were used in an electric vehicle. However, the method of the present invention may be applied to the case estimating the residual capacity of a battery used in an uninterruptible electric power supply unit.

Valve regulated lead acid batteries were used in the foregoing embodiments. However, the method of the present invention may be applied to estimate the residual capacity of a commonly used vent type lead acid battery. Further, the present invention can be widely applied to estimating other types of batteries even those whose residual capacity is varying depending on the open circuit voltage.

INDUSTRIAL APPLICABILITY OF THE INVENTION

As described above, the present invention has an advantage that the residual capacity can be estimated with great accuracy in any of range the residual capacity, and even in cases where the battery has been deteriorated or self discharged.

What is claimed is:

1. A method for estimating a residual capacity of a secondary battery, said method comprising:
   assigning parameters of an internal resistance, a temperature, a discharge current and one of an open circuit voltage and a discharge voltage of the secondary battery;
   collating the parameters with previously determined correlations between the parameters and the residual capacity of the secondary battery; and
   determining the correlations of the secondary battery having a specific history, said determining of the correlations comprising:
      plotting a measured internal resistance and one of the open circuit voltage and the discharge voltage into a voltage-resistance figure;
      measuring discharge capacities corresponding to each plot at a temperature and a discharge current; and
      drawing lines between plots in the voltage-resistance figure such that plots having the same discharge capacity are connected.

2. A method for estimating a residual capacity of a secondary battery said method comprising:
   assigning parameters of an internal resistance a temperature, a discharge current and one of an open circuit voltage and a discharge voltage of the secondary battery;
   collating the parameters with previously determined correlations between the parameters and the residual capacity of the secondary battery; and
   detecting at least two varying parameters selected from the parameters while the secondary battery is in use.

3. A method for estimating a residual capacity of a secondary battery, said method comprising:
   detecting parameters of an open circuit voltage or a discharge voltage and an internal resistance while the secondary battery is in use;
   collating the detected parameters with previously determined correlations between an open circuit voltage or a discharge voltage and an internal resistance and a residual capacity under a temperature and a discharge current to calculate the residual capacity under the temperature and the discharge current; and
   multiplying the residual capacity under the temperature and the discharge current by a temperature coefficient and a discharge current coefficient corresponding to the temperature and the discharge current of a condition under which the secondary battery is in use to calculate the residual capacity of the secondary battery under the condition.

4. The method according to claim 1, further comprising detecting at least two varying parameters selected from the parameters while the secondary battery is in use.

5. The method according to claim 1, wherein the internal resistance plotted into the voltage-resistance figure is expressed as an internal resistance ratio on the basis of an initial internal resistance value define to be 1.0.

6. The method according to claim 2, wherein the at least two varying parameters are the internal resistance and one of the open circuit voltage and the discharge voltage of the secondary battery.

7. A method for estimating a residual capacity of a secondary battery, said method comprising:
   assigning parameters of an internal resistance, a temperature, a discharge current and one of an open circuit voltage and a discharge voltage of the secondary battery; and collating the parameters with previously determined correlations between the parameters and the residual capacity of the secondary battery,
wherein the internal resistance is assigned by an AC four-terminal method or a discharge I-V method.

8. The method according to claim 1, wherein the internal resistance is assigned by an AC four-terminal method or a discharge I-V method.

9. The method according to claim 2, wherein the internal resistance is assigned by an AC four-terminal method or a discharge I-V method.

10. The method according to claim 3, wherein the internal resistance is assigned by an AC four-terminal method or a discharge I-V method.

11. The method according to claim 4, wherein the internal resistance is assigned by an AC four-terminal method or a discharge I-V method.

12. The method according to claim 5, wherein the internal resistance is assigned by an AC four-terminal method or a discharge I-V method.

* * * * *

UNITED STATES PATENT AND TRADEMARK OFFICE
CERTIFICATE OF CORRECTION

PATENT NO.    : 6,920,404 B2
DATED         : July 19, 2005
INVENTOR(S)   : Kenji Yamanaka It is certified that error appears in the above-identified patent and that said Letters Patent is hereby corrected as shown below:

Column 8,
Line 23, please replace "battery said" with -- battery, said --;
Line 24, please replace "resistance a" with -- resistance, a --.

Signed and Sealed this

Twenty-seventh Day of September, 2005

JON W. DUDAS
*Director of the United States Patent and Trademark Office*